US012693327B1

(12) United States Patent
Martens et al.

(10) Patent No.: US 12,693,327 B1
(45) Date of Patent: Jul. 28, 2026

(54) DYNAMIC LOW AND HIGH-FREQUENCY DEVICE CHARACTERIZATION

(71) Applicant: Anritsu Company, Morgan Hill, CA (US)

(72) Inventors: Jon Martens, San Jose, CA (US); Thomas H. Roberts, Morgan Hill, CA (US)

(73) Assignee: Anritsu Company, Morgan Hill, CA (US)

( * ) Notice: Subject to any disclaimer, the term of this patent is extended or adjusted under 35 U.S.C. 154(b) by 95 days.

(21) Appl. No.: 18/386,853

(22) Filed: Nov. 3, 2023

(51) Int. Cl.
*G01R 31/265* (2006.01)
*G01R 31/26* (2020.01)

(52) U.S. Cl.
CPC ..... *G01R 31/2656* (2013.01); *G01R 31/2607* (2013.01)

(58) Field of Classification Search
CPC .......................... G01R 31/2656; G01R 31/2607
USPC ...................................... 324/762.01
See application file for complete search history.

(56) References Cited

U.S. PATENT DOCUMENTS

| | | | | | |
|---|---|---|---|---|---|
| 7,936,173 | B2 * | 5/2011 | Simon | .................... | G01R 35/00 |
| | | | | | 324/637 |
| 9,286,177 | B1 * | 3/2016 | Pritchard | ................ | H04L 43/50 |

| | | | | | |
|---|---|---|---|---|---|
| 9,310,410 | B1 * | 4/2016 | Tsironis | ................. | G01R 27/28 |
| 2005/0171716 | A1 * | 8/2005 | Clarke | ................... | G01R 27/28 |
| | | | | | 702/117 |
| 2007/0007972 | A1 * | 1/2007 | Knauer | .............. | G01R 31/2889 |
| | | | | | 324/677 |

OTHER PUBLICATIONS

Fuchs, Michael, Christoph Maier, and David Pommerenke. "A bias tee for broadband measurement of power electronic components "2021 IEEE International Joint EMC/SI/PI and EMC Europe Symposium. IEEE, 2021. (Year: 2021).*
Sánchez-Muñoz, Juan Pablo, and Reydezel Torres-Torres. "Characterization of bias-dependent ceramic capacitors from reflection coefficient measurements performed using a VNA." IEEE Transactions on Electromagnetic Compatibility 66.2 (2023): 351-358. (Year: 2023).*

* cited by examiner

*Primary Examiner* — Christopher P Mcandrew

(74) *Attorney, Agent, or Firm* — Kilpatrick Townsend & Stockton LLP

(57)                ABSTRACT

Examples provide internally reconfigurable bias tees for a vector network analyzer. The bias tees can have component sizes that can be electronically switched during device testing. To reduce test time when multiple tests are conducted, examples can further provide for automatic tuning of one or more components of a bias tee, where the one or more components are tuned for the test being performed.

20 Claims, 5 Drawing Sheets

300

INSERTION
LOSS

A

B

C

FREQUENCY

DYNAMIC LOW AND HIGH-FREQUENCY DEVICE CHARACTERIZATION

BACKGROUND

Wireless communication has become ubiquitous in daily life. Cell phones, computers, and home networks, as well as a growing array of smart and connected devices, such as speakers, lights, and home appliances, all communicate wirelessly. These devices are made up of electronic components, such as transistors, amplifiers, multiplexers, mixers, frequency multipliers, and others. These electronic components can be combined into more complicated modules and subsystems.

Each of these components, modules, and subsystems might need to be tested during development and manufacturing. Some of these tests can be performed at low-frequencies, while others can be performed at high-frequencies. A low-frequency test can involve applying one or more DC or low-frequency bias signals to a component, module, or subsystem being tested. A high-frequency test can involve providing a radio-frequency (RF) test or stimulus signal to the component, module, or subsystem being tested. During these high-frequency tests, it can also be desirable to be able to put these components, modules, or subsystems in a state where they can be tested by applying one or more DC or low-frequency bias signals.

It might be necessary to perform a large number of these tests. It might also be necessary to test a large number of components, modules, or subsystems. Accordingly, it can also be desirable to perform these low-frequency and high-frequency tests in a quick, efficient manner.

Thus, what is needed are circuits, methods and apparatus that can perform rapid testing of components, modules, and subsystems, where the testing includes both low-frequency and high-frequency tests.

SUMMARY

Accordingly, embodiments of the present invention can provide circuits, methods and apparatus that can perform rapid testing of components, modules, and subsystems, where the testing includes both low-frequency and high-frequency tests. An illustrative embodiment of the present invention can provide bias tees or diplexers that can facilitate high-frequency testing by, as an example, providing RF signals to a component, module, or subsystem (referred to here as a device) and receiving RF signals that are output from the device. The bias tees or diplexers can facilitate low-frequency testing by, as an example, providing a DC or low-frequency input bias signal to the device and receiving a low-frequency output voltage or current. These bias tees or diplexers can include a capacitor for providing a high-pass path for RF stimulus signals and an inductor for providing a low-pass path for biasing and other low-frequency signals. These bias tees can be located in a test system, such as a vector network analyzer, and can be internally reconfigurable to decrease test time, particularly as compared to the conventional method of manually and physically replacing bias-tees when switching between types of tests.

Various tests can be performed using such a vector network analyzer. For example, low-frequency tests, such as those performed to generate transistor or current-voltage curves, can be done using these bias tees. In this example, a stepped voltage can be applied to a gate of transistor through an inductor of a first bias tee, while a low-frequency voltage signal can be swept at the drain of the transistor through an inductor of a second bias tee. The resulting drain current can be monitored, again through the inductor of the second bias tee, and transistor curves for the transistor being tested can be generated. During these tests, it can be desirable to be able to step the gate voltage and sweep the drain voltage quickly to reduce the overall test time. To improve this low-frequency testing, it can be desirable that the bias tees have a relatively high-frequency response for both the high-pass and the low-pass paths. Other low-frequency tests, such as the measurement of a beta of a bipolar transistor, might be better tested with bias tees having a very low bandwidth. That is, these and other tests that benefit from noise reduction can be performed with the very low bandwidth bias tees.

High-frequency tests, such as s-parameter tests, can also be performed using these bias tees. As part of this testing, an RF input signal can be applied to a gate of a transistor though a capacitor of the first bias tee, and a resulting RF output signal at a drain of the transistor can be provided through a capacitor of the second bias tee. Voltages or currents to bias the transistor can be provided through the inductors of the bias tees as needed. The ratio of the RF output signal at the drain to the RF input signal at the gate can be the $S_{21}$ parameter of the transistor. To improve this high-frequency testing, it can be desirable that the bias tees have a lower frequency response such that they have more RF range. This increased RF range does come at the cost of more bias tee bandwidth, which can allow more noise. It should be noted that the other S-parameters (not just $S_{21}$) can be measured with $S_{21}$ along with other quantities such as distortion products and noise figure.

As a result of performing these tests at different frequencies, it can be desirable that one or more of the components of the bias tees be adjustable. But bias tees are typically fixed or can only be varied by manually and physically removing and replacing one or more components. Accordingly, embodiments of the present invention can further provide bias tees having component values that are internally reconfigurable, that is they have component values that can be dynamically and electronically controlled. To reduce test time when multiple tests are conducted, embodiments of the present invention can provide for automatic tuning of one or more components of a bias tee, where the one or more components are tuned for the test being performed.

An illustrated embodiment of the present invention can provide a test system including one or more bias tees and a vector network analyzer having test ports. The bias tees can be located in the vector network analyzer and can be coupled to the test ports. The test ports can be further coupled to an external device that is to be tested. Alternatively, the bias tees can be external to the vector network analyzer and the test ports can connect to the external bias tees, which in turn can be connected to the external device that is to be tested. The vector network analyzer can include a source circuit for providing high-frequency signals to the bias tees, and a measuring circuit to measure the resulting high-frequency signals from the bias tees. The vector network analyzer can include control lines for varying component values of the bias tees. The vector network analyzer can further provide bias voltages to the bias tees during high-frequency testing.

The system can further include a DC parameter analyzer. The DC parameter analyzer can include control lines for varying component values of the bias tees. The DC parameter analyzer can further include ports for providing low-frequency bias voltages or currents, and for measuring resulting low-frequency voltages and currents from the bias tees. In these and other embodiments of the present invention, the DC parameter analyzer can be replaced by other DC tools, such as programmable or swept power supplies and power meters. This equipment can be referred to as a DC parameter analyzer herein for simplicity.

In these and other embodiments of the present invention, the vector network analyzer, the bias tees, and the DC parameter analyzer can be combined into a test system in various ways. For example, the bias tees can be separate from the vector network analyzer and the DC parameter analyzer, or they can be part of the vector network analyzer or the DC parameter analyzer. For example, one or more bias tees can be fixed in place in the vector network analyzer such that they are not user accessible or user replaceable. The vector network analyzer, bias tees, and DC parameter analyzer can be combined in a single test unit.

In these and other embodiments of the present invention, the components of the bias tees can be adjusted in various ways. For example, series inductors can be switched in and out to vary a biasing inductor. The inductance value can be changed using these switches, as can the current carrying capability of the inductors, for example physically larger inductors can be switched in to increase the current carrying capability of the inductors. Tunable inductors using movable cores or variable mutual inductance can be used as well. Parallel capacitors can be switched in and out, or varactors can be used to vary the high-pass RF signal path of the bias tees.

In these and other embodiments of the present invention, the bias tees can be isolated from the measurement circuit using RF couplers. For example, a first RF coupler can couple an input signal to the measurement circuit and a second RF coupler can couple an output signal to the measurement circuit. This can help to isolate and stabilize measurements using the bias tees, allowing a further reduction in test sequence time.

Different numbers of test ports and different numbers of bias tees can be included in vector network analyzers provided by these and other embodiments of the present invention. For example, a vector network analyzer can include "N" number of test ports and "M" configurable bias tees, each bias tee in a different one of the paths of M of the N test ports, where M is less than or equal to N. For example, a vector network analyzer can include two test ports, where each test port can include a configurable bias tee. A vector network analyzer can include two test ports, where one test port can include a configurable bias tee. A vector network analyzer can include three test ports, where one, two, or three test ports can each include a configurable bias tee. A vector network analyzer can include four test ports, where one, two, three, or four test ports can each include a configurable bias tee. In these and other embodiments of the present invention, some or all of the bias tees can be configurable, while the remaining bias tees (if any) can be nonconfigurable. The configurable bias tees can all be configurable in the same way, or one or more can be configurable in different ways from each other. They can be configured in different ways depending on a frequency range of a test being performed, a type of test being performed, whether they are coupling input or output signals, or for other reasons. In these and other embodiments of the present invention, the bias tees can be located in a vector network analyzer. Alternatively, one or more of the M bias tees can be external to the vector network analyzer. One or more of the M bias tees can be located in a second device, such as a DC parameter analyzer. One or more of the M bias tees can be located in each of one or more locations including a vector network analyzer, in a DC parameter analyzer, or external to the vector network analyzer and the DC parameter analyzer.

In these and other embodiments of the present invention, the bias tees, including the variable inductors, can include damping circuits or components, such as capacitors or resistors. These capacitors or resistors can help to dampen resonances and improve the response shapes. This can improve stability of the bias tees.

These and other embodiments of the present invention can provide code for a computer-readable storage medium. The computer-readable storage medium can be a fixed memory in one or both the vector network analyzer and the DC parameter analyzer. The computer-readable storage medium can be a removable memory, such as a secure-digital card, that is inserted into either or both the vector network analyzer and the DC parameter analyzer. The code can cause a processor to determine a test to be performed on a device. Based on the test, the code can cause the processor to determine a first configuration for a first component of a first bias tee and a second configuration for a second component of a second bias tee. The code can cause the processor to send a first signal to configure the first component in the first configuration and send a second signal to configure the second component in the second configuration. The code can then cause the processor to conduct the determined test.

Various embodiments of the present invention can incorporate one or more of these and the other features described herein. A better understanding of the nature and advantages of the present invention can be gained by reference to the following detailed description and the accompanying drawings.

DESCRIPTION OF ILLUSTRATIVE EMBODIMENTS

Figure 1:
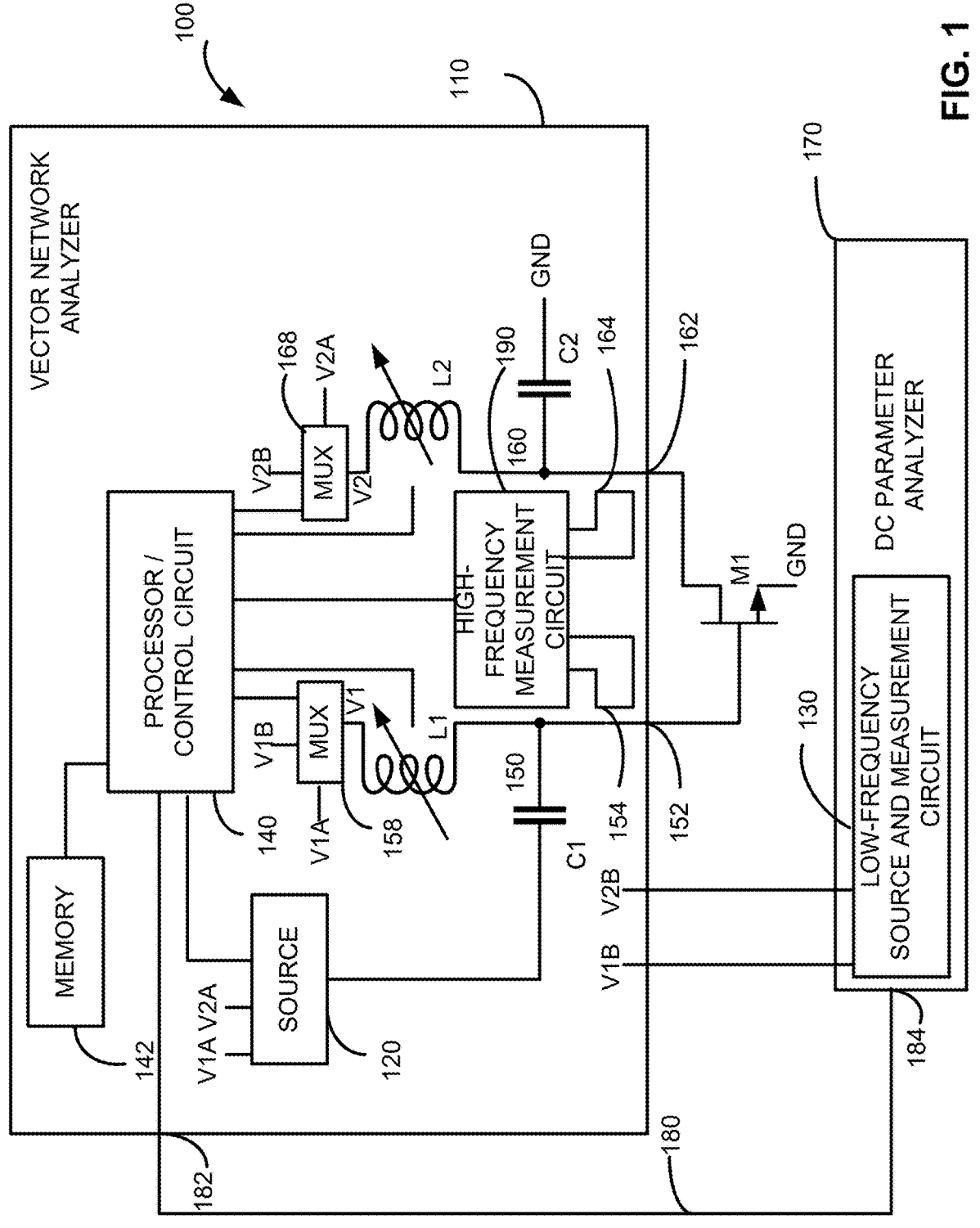
FIG. 1 illustrates a test system according to an embodiment of the present invention.

FIG. 1 illustrates a test system according to an embodiment of the present invention. This figure, along with the other included figures, is shown for illustrative purposes and does not limit either the possible embodiments of the present invention or the claims.

Test system 100 can include vector network analyzer 110 having internally reconfigurable bias tees 150 and 160, along with DC parameter analyzer 170. Vector network analyzer 110 and DC parameter analyzer 170 can communicate over a communication path, shown in this example as cable 180.

Vector network analyzer 110 can include source 120. Depending on a test to be performed, source 120 can provide a test signal comprising a high-frequency signal to capacitor C1 in bias tee 150. For example, when a high-frequency test is being performed, source 120 can provide an RF or other high-frequency test signal. This test signal from source 120 can pass through capacitor C1 of bias tee 150 to test port 152.

An input of a device to be tested (or device under test or DUT) can be coupled to test port 152 to receive the output from bias tee 150. In this example, transistor M1 can be tested, though in other embodiments of the present invention, other circuits, such as components, modules, or subsystems can be tested. An output signal from the device being tested, M1, can be coupled to test port 162. Bias tee 160 can be connected to test port 162. During high-frequency tests, bias voltages for transistor M1 can be provided by source 120, which can generate voltage VIA and voltage V2A and provide them as voltage V1 to inductor L1 in bias tee 150 and voltage V2 to inductor L2 in bias tee 160 via multiplexer 158 and multiplexer 168, respectively. Multiplexer 158 and multiplexer 168 can be controlled by processor and control circuit 140.

For this higher-frequency testing, RF couplers can be used. For example, RF coupler 154 can couple an input signal provided to the device being tested to high-frequency measurement circuit 190. Similarly, RF coupler 164 can couple an output signal provided by the device being tested to high-frequency measurement circuit 190. In this way, high-frequency measurement circuit 190 can generate s-parameter or other high-frequency test results. Use of RF couplers 154 and 164 can isolate bias tee 150 and bias tee 160 from high-frequency measurement circuit 190 during these high-frequency tests. In these and other embodiments of the present invention, RF couplers 154 and 164 can be omitted or placed elsewhere in test system 100.

DC parameter analyzer 170 can include low-frequency source and measurement circuit 130. Low-frequency source and measurement circuit 130 and high-frequency measurement circuit 190 can operate separately or in conjunction. For low-frequency tests, low-frequency source and measurement circuit 130 can generate a bias voltage V1B and provide the bias voltage to inductor L1 in bias tee 150 in vector network analyzer 110 via multiplexer 158. Bias voltage V1 can be applied through inductor L1 in bias tee 150 to test port 152 to a gate of the device being tested, transistor M1. An output from the drain of M1 can be fed through test port 162 to inductor L2 in bias tee 160. A current supplied by bias voltage V2 (via bias voltage V2B) can be measured by low-frequency source and measurement circuit 130. Low-frequency source and measurement circuit 130 can vary the voltage V2B, which can be applied through multiplexer 168 as V2 to inductor L2 in bias tee 160, for example to generate current-voltage curves.

Vector network analyzer 110 can further include processor and control circuit 140. In these and other embodiments of the present invention, processor and control circuit 140 can be implemented as separate circuits. Processor and control circuit 140 can control source 120 and low-frequency source and measurement circuit 130 and can read data from low-frequency source and measurement circuit 130 and high-frequency measurement circuit 190. In this way, processor and control circuit 140 can generate test data on the device being tested. Processor and control circuit 140 can provide measurement instructions to, and read measured data from, low-frequency source and measurement circuit 130 and high-frequency measurement circuit 190. Processor and control circuit 140 can select source 120 to provide bias voltages or currents through multiplexer 158 and multiplexer 168 during high-frequency tests, and processor and control circuit 140 can select low-frequency source and measurement circuit 130 to provide the bias voltages and currents during low-frequency tests.

One or more of the components of bias tee 150 and one or more of the components of bias tee 160 can be variable. In this example, inductor L1 in bias tee 150 and inductor L2 in bias tee 160 are shown as being variable under the control of processor and control circuit 140. Inductor L1 in bias tee 150 and inductor L2 in bias tee 160 can include individual inductors that are switched in and out to vary the total inductance. In these and other embodiments of the present invention, inductors have moving cores or variable mutual inductances can be used as variable inductors. In these and other embodiments of the present invention, capacitor C1 in bias tee 150 and capacitor C2 in bias tee 160 can be variable under the control of processor and control circuit 140. For example, capacitor C1 and capacitor C2 can be implemented using switched capacitor arrays, varactor diodes, or other variable capacitors. This variability can allow test system 100 to perform low-frequency tests and well as high-frequency tests. In these and other embodiments of the present invention, transistors or other switches in parallel or series with inductors can also be used to vary the total inductance.

Vector network analyzer 110 can further include memory 142. Memory 142 can be a computer-readable storage medium. Memory 142 can be a fixed memory, it can be a memory formed or housed with the processor and control circuit 140, it can be a removable memory, such as a secure digital card, or it can be another type of memory. Memory 142 can store data such as procedures for various tests, settings for variable bias tee components for the different tests, measurement results, and other types of data.

DC parameter analyzer 170 can communicate through bus or cable 180 with vector network analyzer 110. Cable 180 can be connected to DC parameter analyzer 170 at connector 184 and to vector network analyzer 110 at connector 182. Cable 180 can convey Universal Serial Bus signals, general-purpose input-output signals, Ethernet, or signals consistent with other standard or proprietary communication protocol. DC parameter analyzer 170 can provide instructions to processor and control circuit 140 regarding tests to be performed. For example, DC parameter analyzer 170 can provide instructions to processor and control circuit 140 regarding lower-frequency tests.

The various functions outlined here can be performed by different circuits in test system 100. For example, instead of processor and control circuit 140 providing control signals to variable inductors L1 and L2, DC parameter analyzer 170 can provide the control signals, or DC parameter analyzer 170 and processor and control circuit 140 can each provide the control signals, depending on the tests being performed. The voltages V1 and V2 can be provided by either source 120 in vector network analyzer 110 or low-frequency source and measurement circuit 130 in DC parameter analyzer 170. More specifically, multiplexer 158 and multiplexer 168 can be used to selectively provide low-frequency signals from source 120 or low-frequency source and measurement circuit 130. In these and other embodiments of the present invention, RF coupler 154 and RF coupler 164 can be omitted, and high-frequency measurement circuit 190 can perform direct measurements.

In general, high-frequency tests can be conducted by vector network analyzer 110 while lower frequency tests can be conducted by DC parameter analyzer 170. In these and other embodiments of the present invention, both vector network analyzer 110 and DC parameter analyzer 170 can share tasks for a test. In these and other embodiments of the present invention, an external controller (not shown) can control either or both the vector network analyzer 110 and DC parameter analyzer 170 during one or more tests.

Also, capacitor C2 is shown as connecting to ground. In these and other embodiments of the present capacitor C2 can be coupled to a second source (not shown.) This second source can be used for s-parameter and other testing. The second source can be part of source 120 or it can be a separate source.

The various circuits and components shown here can be rearranged in these and other embodiments of the present invention. As shown, bias tee 150 and bias tee 160 can be placed in vector network analyzer 110. They can be internally reconfigurable bias tees that are fixed in place and are not user serviceable or replaceable. As a result, they can save a user considerable time during testing as compared to having to manually remove and replace each bias tee by hand for different measurements. In these and other embodiments of the present invention, bias tee 150 and bias tee 160 can be separate from vector network analyzer 110. In these and other embodiments of the present invention, DC parameter analyzer 170 can be included in vector network analyzer 110. In these and other embodiments of the present invention, DC parameter analyzer 170, vector network analyzer 110, bias tee 150, and bias tee 160 can be included as a single test device.

In these and other embodiments of the present invention, the DC parameter analyzer 170 can be replaced by other DC tools, such as programmable or swept power supplies and power meters (not shown.) This equipment can be referred to as a DC parameter analyzer 170 herein for simplicity. Also, while vector network analyzer 110 is shown as having two ports, vector network analyzer 110 can have other numbers of ports, such as one port, three ports, or more than three ports.

Also, while each test port is shown as having a bias tee, bias tees can be absent from one or more test ports of vector network analyzer 110, that is, the number of ports and bias tees are not necessarily equal. Different numbers of test ports, such as test port 152 and test port 162, and different numbers of bias tees, such as bias tee 150 and bias tee 160, can be included in vector network analyzer 110. For example, vector network analyzer 110 can include "N" number of test ports and "M" bias tees, each bias tee in a different one of the paths of M of the N ports, where M is less than or equal to N. For example, vector network analyzer 110 can include two test ports, test port 152 and test port 162, where test port 152 can include bias tee 150 and test port 152 can include bias tee 160. Vector network analyzer 110 can include two test ports, where one port can include a bias tee. Vector network analyzer 110 can include three test ports, where one, two, or three test ports can each include a bias tee. Vector network analyzer 110 can include four test ports, where one, two, three, or four test ports can each include a bias tee. In these and other embodiments of the present invention, some or all of the bias tees can be configurable, while the remaining bias tees (if any) can be nonconfigurable. The configurable bias tees can all be configurable in the same way, or one or more can be configurable in different ways from each other. They can be configured in different ways depending on a frequency range of a test being performed, a type of test being performed, whether they are coupling input or output signals, or for other reasons. In these and other embodiments of the present invention, the bias tees can be located in vector network analyzer 110. Alternatively, one or more of the M bias tees can be external to vector network analyzer 110. One or more of the M bias tees can be located in a second device, such as DC parameter analyzer 170. One or more of the M bias tees can be located in each of one or more locations including vector network analyzer 110, in DC parameter analyzer 170, or external to vector network analyzer 110 and DC parameter analyzer 170.

Various tests can be performed using test system 100. For example, low-frequency tests, such as the generation of transistor or current-voltage curves, can be performed using these bias tees. In this example, a stepped voltage can be applied to a gate of transistor while a low-frequency voltage signal can be swept at the drain of the transistor. The drain current can be monitored and the transistor curves can be generated. During these tests, it can be desirable to be able to step the gate voltage and sweep the drain voltage quickly to reduce the overall test time. To improve this low-frequency testing, it can be desirable that the bias tees have a relatively higher frequency response as compared to tests involving only DC measurements. An example of such a test that can be completed with test system 100 is shown in the following figure.

Figure 2:
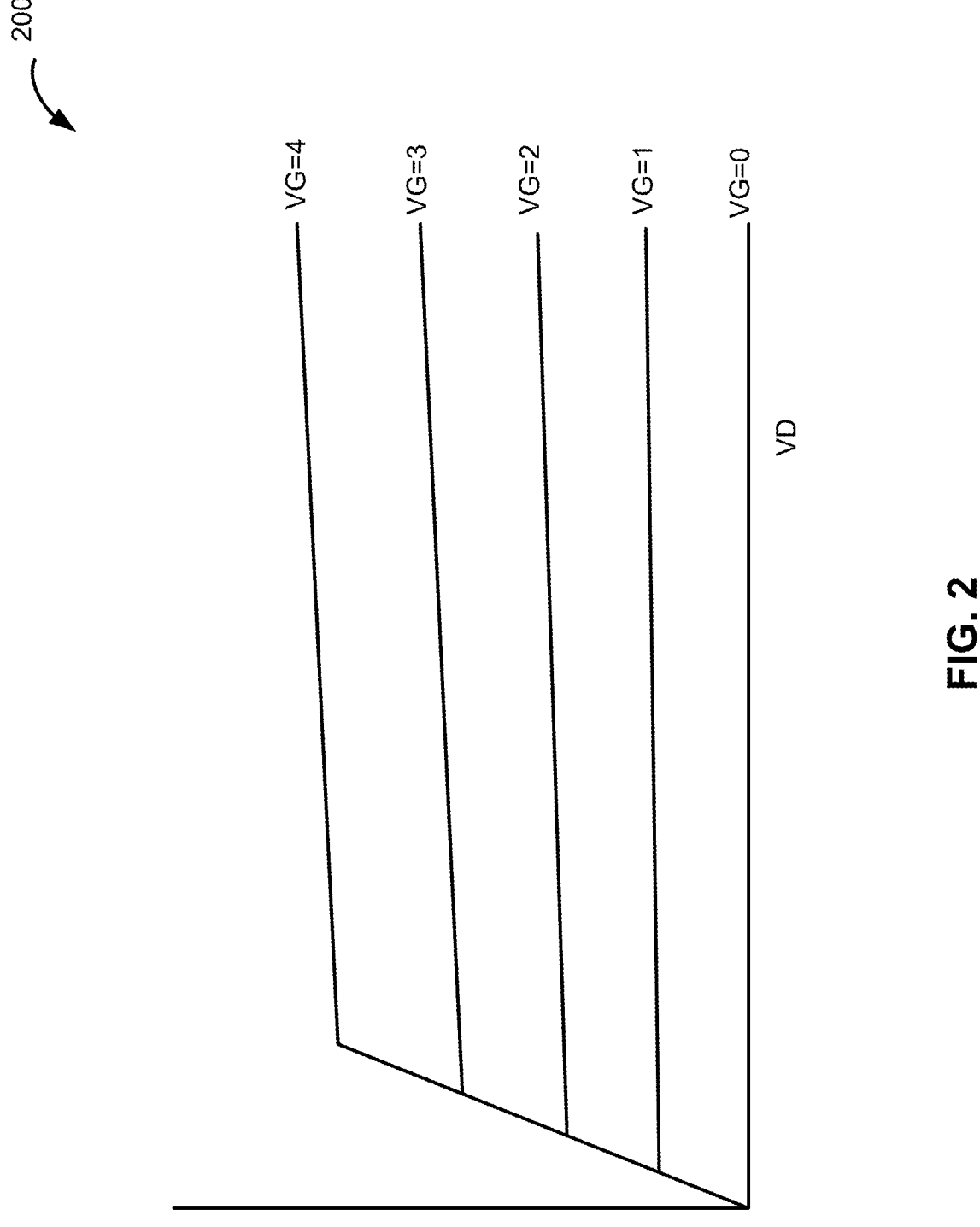
FIG. 2 illustrates a test that can be performed by the test system of FIG. 1.

FIG. 2 illustrates a test that can be performed by the test system of FIG. 1. In graph 200, drain current ID is measured at various gate voltages VG while the drain voltage VD is swept. That is, the bias V1 in FIG. 1 is set to a voltage by low-frequency source and measurement circuit 130. This V1 voltage is applied to the gate of transistor M1 through inductor L1. The voltage V2 is applied to the drain of transistor M1 through inductor L2 and is swept while the current drawn by the voltage V2 is measured, again by low-frequency source and measurement circuit 130. This can be repeated for a number of gate voltages VG to generate graph 200.

Accurate curves can be generated from tens of thousands of data points. This could require a significant amount of time to accomplish using bias tees with insufficient bandwidth. For example, in FIG. 1, if bias tee 150 has a slow response time, the curves in this figure could take an excessive amount of time to complete. Accordingly, the frequency response of bias tee 150 can be widened to ensure that the voltage VG can be stepped and the voltage VD can be swept at a reasonable rate. An example is shown in the following figure.

Figure 3:
FIG. 3 illustrates insertion losses for a bias tee according to an embodiment of the present invention.

FIG. 3 illustrates insertion losses for a bias tee according to an embodiment of the present invention. In graph 300, curve A illustrates the insertion loss of a bias tee, such as bias tee 160, through capacitor C2 to the common node between capacitor C2 and inductor L2, while curve B illustrates the insertion loss through the inductor L2 to the common node between capacitor C2 and inductor L2. The bandwidths or insertion losses are not independent of each other, so the bandwidth of both can be changed by changing the value of inductor L2. For example, to provide extra bandwidth to generate the curves in FIG. 2, the size of inductor L2 can be reduced. The same can be done to inductor L1 in bias tee 150.

When other low-frequency tests are being performed, the size of inductor L2 can be increased to decrease the bandwidth of the low-frequency bias. This can help to improve the noise performance and the stability of the test measurements being taken.

As another example, high-frequency tests, such as s-parameter tests, can be performed using test system 100. As part of this testing, an RF signal can be applied to a gate of a transistor and a resulting RF signal at a drain of the transistor can be measured. The ratio of the RF signal at the drain to the RF signal at the gate can be the $S_{21}$ parameter of the transistor. To improve this high-frequency testing, it can be desirable that the bias tees have a relatively low-frequency response for both the high-pass and the low-pass paths. This can be achieved by increasing the sizes of inductor L1 in the bias tee 150 and inductor L2 in bias tee 160. That is, to improve this high-frequency testing, it can be desirable that bias tee 150 and bias tee 160 have lower frequency responses such that they have more RF range. This increased RF range does come at the cost of more bandwidth for bias tee 150 and bias tee 160, which can allow more noise. It should be noted that the other S-parameters (not just $S_{21}$) can be measured with $S_{21}$ along with other quantities such as distortion products and noise figure.

Also, it can be desirable that bias tee 150 provide a 50 ohm impedance at the gate of device M1 and that bias tee 160 provide a 50 ohm impedance at the drain of device M1. Since the impedance of bias tee 150 and the impedance of bias tee 160 vary over frequency, it can be desirable to vary the inductance of L1 and the inductance of L2 such that the impedance of bias tee 150 and the impedance of bias tee 160 remain close to 50 ohms over different test conditions. An example of an inductive component that can have a variable inductance that is controlled by processor and control circuit 140 is shown in the following figure.

Figure 4:
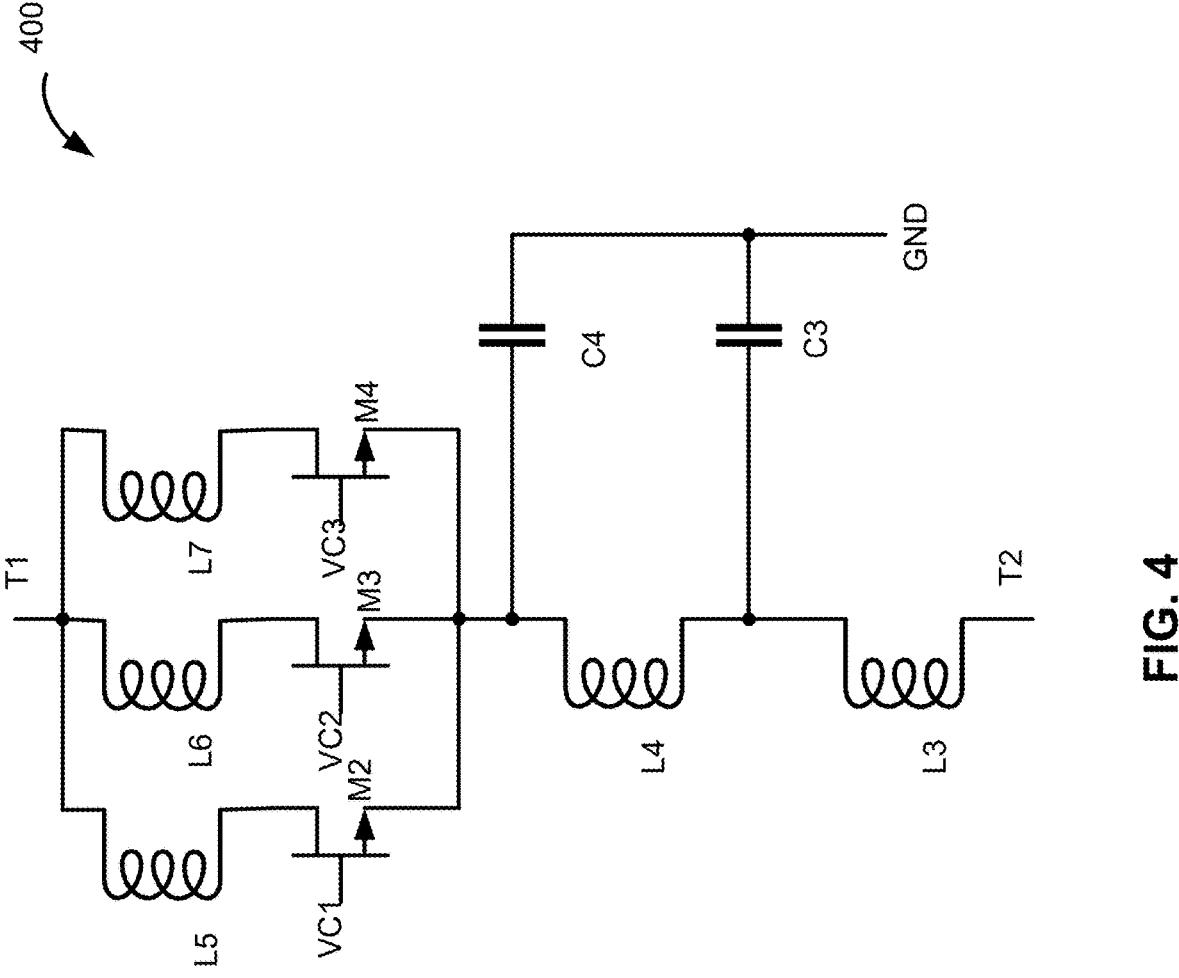
FIG. 4 illustrates a variable component for a bias tee according to an embodiment of the present invention.

FIG. 4 illustrates a variable component for a bias tee according to an embodiment of the present invention. Variable component 400 can be a variable component, such as inductor L1 in bias tee 150 or inductor L2 in bias tee 160. Variable component 400 can include a small-value high-frequency inductor L3, a larger inductor L4, and one of even larger inductors L5, L6, or L7. The inductors L5, L6, or L7 can be selectively included in the total inductance between terminal T1 and terminal T2. The inductors L5, L6, or L7 can be selected by transistors M2, M3, and M4, respectively, under the control of control signals VC1, VC2, and VC3, respectively, from processor and control circuit 140. Transistors M2, M3, and M4 can be power transistors to reduce their series impedances and improve the testing capability of test system 100. Transistors M2, M3, and M4 can instead be pass gates, mechanical switches, relays, or other types of switching components. Additional components, such as resistors and capacitors, can be added to improve the performance of bias tee 150 and bias tee 160. These capacitors or resistors can help to dampen resonances and improve the response shapes. This can improve stability of bias tee 150 and bias tee 160. In this example, capacitors C3 and C4 can be added to dampen the frequency response of the intermediate nodes between the individual inductors. This can help to stabilize bias tee 150 and bias tee 160 for improved measurement performance.

Figure 5:
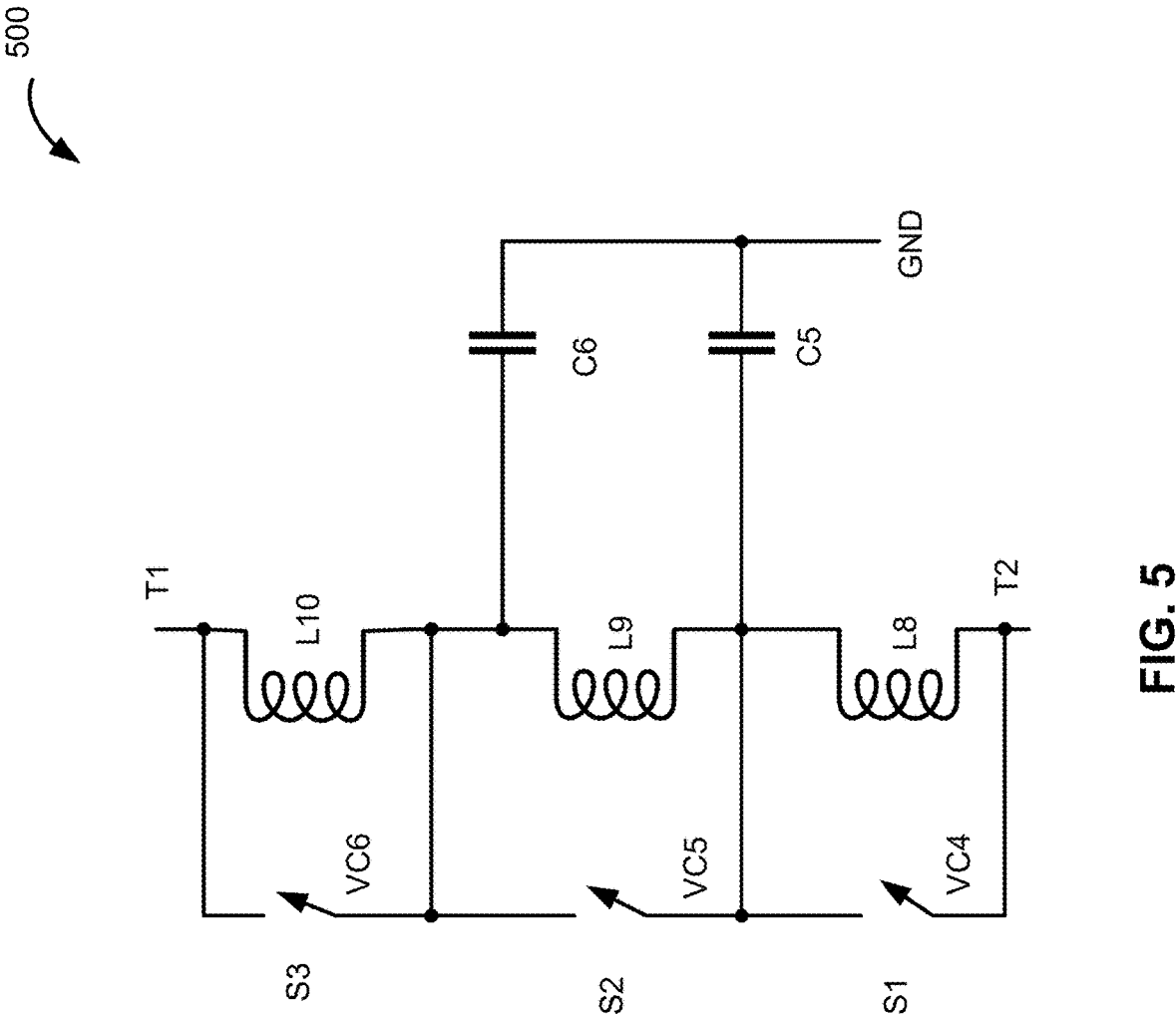
FIG. 5 illustrates another variable component for a bias tee according to an embodiment of the present invention.

FIG. 5 illustrates another variable component for a bias tee according to an embodiment of the present invention. Variable component 500 can be a variable component, such as inductor L1 in bias tee 150 or inductor L2 in bias tee 160. Variable component 500 can include a small-value high-frequency inductor L8, a larger inductor L9, and an even larger inductor L10. The inductors L8, L9, and L10 can be selectively included in the total inductance between terminal T1 and terminal T2. The inductors L8, L9, and L10 can be shorted or bypassed by switches S1, S2, and S3, respectively, under the control of control signals VC4, VC5, and VC6, respectively, from processor and control circuit 140. Switches S1, S2, and S3 can be power transistors to reduce their series impedances and improve the testing capability of test system 100. Switches S1, S2, and S3 can instead be pass gates, mechanical switches, relays, or other types of switching components. Additional components, such as resistors and capacitors, can be added to improve the performance of bias tee 150 and bias tee 160. These capacitors or resistors can help to dampen resonances and improve the response shapes. This can improve stability of bias tee 150 and bias tee 160. In this example, capacitors C5 and C6 can be added to dampen the frequency response of the intermediate nodes between the individual inductors. This can help to stabilize bias tee 150 and bias tee 160 for improved measurement performance.

While this example is shown as using transistors or switches in series or parallel with individual inductors, in other embodiments of the present invention, other types of variable inductors can be used. For example, tunable inductors with movable cores can be used. Inductors having variable mutual inductance can be used. Also, instead of inductors, variable capacitors, such as switch arrays or varactors can be used. Also, while specific numbers of inductors are shown in these examples, other numbers of switches, transistors, inductors, and other components, and other combination of series and parallel connectors can be used to implement variable component 400 and variable components 500. A combination of one or more of these and other techniques can also be used in these and other embodiments of the present invention.

The above description of embodiments of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications to thereby enable others skilled in the art to best utilize the invention in various embodiments and with various modifications as are suited to the particular use contemplated. Thus, it will be appreciated that the invention is intended to cover all modifications and equivalents within the scope of the following claims.

What is claimed is:

1. A test system comprising:
a vector network analyzer having a first number of test ports;
a second number of bias tees, each of the second number of bias tees coupled to a different one of the first number of test ports, wherein at least one of the second number of bias tees comprises a variable component, and wherein the second number is less than or equal to the first number; and
a DC parameter analyzer having a first port to provide a first bias output, wherein the first number of test ports of the vector network analyzer includes a first test port to provide an input radio-frequency (RF) signal, wherein the second number of bias tees includes a first bias tee to receive the input RF signal and the first bias output, and wherein the first bias tee comprises a first variable component.

2. The test system of claim 1 wherein the vector network analyzer further comprises a second test port to receive an output RF signal, the DC parameter analyzer comprises a second port to provide a second bias output, and the test system further comprises a second bias tee to provide the output RF signal and the second bias output, wherein the second bias tee comprises a second variable component.

3. The test system of claim 2 wherein the vector network analyzer further comprises a control circuit having a first control line output to provide a first control signal, where the first control signal adjusts the first variable component, and a second control line output to provide a second control signal, where the second control signal adjusts the second variable component.

4. The test system of claim 2 wherein the DC parameter analyzer further comprises a first control line output to provide a first control signal, where the first control signal adjusts the first variable component, and a second control line output to provide a second control signal, where the second control signal adjusts the second variable component.

5. The test system of claim 2 wherein the first bias tee and the second bias tee are included in the vector network analyzer.

6. The test system of claim 2 wherein the first bias tee is isolated from a measurement circuit of the vector network analyzer by a first RF coupler and the second bias tee is isolated from the measurement circuit of the vector network analyzer by a second RF coupler.

7. The test system of claim 2 wherein the first bias tee and the second bias tee are included in the DC parameter analyzer.

8. The test system of claim 2 wherein the first bias tee, the second bias tee and the DC parameter analyzer are included in the vector network analyzer.

9. The test system of claim 2 wherein the first variable component is an inductor formed by a first series of inductors that are switchable using a first plurality of switches and the second variable component is an inductor formed by a second series of inductors that are switchable using a second plurality of switches.

10. The test system of claim 9 wherein the first variable component further comprises a first plurality of damping components coupled to inductors in the first series of inductors and the second variable component further comprises a second plurality of damping components coupled to inductors in the second series of inductors.

11. A vector network analyzer comprising:
    a first number of test ports;
    a second number of bias tees, each of the second number of bias tees coupled to a different one of the first number of test ports, wherein at least one of the second number of bias tees comprises a variable component, and wherein at least one of the second number of bias tees are housed in the vector network analyzer, and wherein the second number is less than or equal to the first number;
    a first radio frequency (RF) source to provide a first RF signal;
    a first bias tee in the second number of bias tees to receive the first RF signal, wherein the first bias tee comprises a first variable component, wherein the first bias tee provides a second RF signal, and wherein the first bias tee is housed in the vector network analyzer;
    a first test port in the first number of test ports to provide the second RF signal to a device-under-test, the device-under-test external to the vector network analyzer;

a second test port in the first number of test ports to receive a third RF signal from the device; and
    a second bias tee in the second number of bias tees to receive the third RF signal, wherein the second bias tee comprises a second variable component, and wherein the second bias tee is housed in the vector network analyzer.

12. The vector network analyzer of claim 11 wherein the first bias tee and the second bias tee are not user replaceable components.

13. The vector network analyzer of claim 12 wherein the first bias tee and the second bias tee are fixed in place in the vector network analyzer and are not intended to be removed.

14. The vector network analyzer of claim 12 wherein the first RF signal is received by a first capacitor of the first bias tee and a bias voltage is received by the first variable component, where the first variable component is an inductor component.

15. The vector network analyzer of claim 14 wherein the inductor component comprises a first switch coupled to a first inductor.

16. The vector network analyzer of claim 15 wherein the vector network analyzer further comprises a control circuit having a control line output coupled to a gate of the first switch.

17. A computer-readable storage medium having stored therein program code instructions that, when executed by a processor in the vector network analyzer of claim 1, cause the processor to perform a method comprising:
    determine a test to be performed on a device;
    based on the test, determine a first configuration for a first component of a first bias tee in the second number of bias tees;
    based on the test, determine a second configuration for a second component of a second bias tee in the second number of bias tees;
    send a first signal to configure the first component in the first configuration; and
    send a second signal to configure the second component in the second configuration.

18. The computer-readable storage medium of claim 17 wherein the first component is a first variable inductor comprising a first plurality of individual inductors and the second component is a second variable inductor comprising a second plurality of individual inductors.

19. The computer-readable storage medium of claim 18 wherein the first signal drives a gate of a first switch having a drain coupled to a first inductor in the first plurality of individual inductors and the second signal drives a gate of a second switch having a drain coupled to a first inductor in the second plurality of individual inductors.

20. The computer-readable storage medium of claim 17 wherein the computer-readable storage medium is a memory in the vector network analyzer.

* * * * *